(12) United States Patent
Hsu et al.

(10) Patent No.: US 7,816,704 B2
(45) Date of Patent: Oct. 19, 2010

(54) METHOD FOR PACKAGING A LIGHT EMITTING DEVICE INCLUDING A METAL REFLECTION LAYER AND A METAL HEAT DISSIPATION LAYER

(75) Inventors: Tsang-Lin Hsu, Taipei Hsien (TW); Heng-I Lin, Taipei Hsien (TW)

(73) Assignee: Liung Feng Industrial Co., Ltd., Taipei Hsien (TW)

( * ) Notice: Subject to any disclaimer, the term of this patent is extended or adjusted under 35 U.S.C. 154(b) by 0 days.

(21) Appl. No.: 12/292,054

(22) Filed: Nov. 12, 2008

(65) Prior Publication Data
US 2009/0242916 A1    Oct. 1, 2009

(30) Foreign Application Priority Data
Mar. 27, 2008    (TW) ............................... 97111139 A

(51) Int. Cl.
*H01L 21/00* (2006.01)
*H01L 21/44* (2006.01)
*H01L 33/00* (2006.01)

(52) U.S. Cl. ........................... 257/98; 257/100; 438/29; 438/678

(58) Field of Classification Search .................. 438/29, 438/678; 257/E33.072, 98, 100
See application file for complete search history.

(56) References Cited

U.S. PATENT DOCUMENTS

| 7,387,915 B2* | 6/2008 | Su et al. ..................... 438/122 |
| 2002/0176036 A1* | 11/2002 | Kaneko ....................... 349/65 |
| 2002/0187571 A1* | 12/2002 | Collins et al. ................ 438/29 |
| 2009/0072251 A1* | 3/2009 | Chan et al. .................... 257/89 |

FOREIGN PATENT DOCUMENTS

WO    WO 2004/025741 A1 *  3/2004

* cited by examiner

*Primary Examiner*—William M. Brewster
(74) *Attorney, Agent, or Firm*—Rosenberg, Klein & Lee

(57) ABSTRACT

A method for packaging a light emitting element includes a step of providing a carrier formed with an anode electrode and a cathode electrode, a step of providing a light emitting object by utilizing a light emitting diode chip having a positive and negative electrodes, a step of directly contacting the carrier and the light emitting diode chip to establish electrical communication among the anode and cathode electrodes and the positive and negative electrodes, and a step of firmly bonding the carrier and the light emitting diode chip by which to simplify assembling procedure and further to reduce manufacturing cost and enhance production efficiency.

14 Claims, 6 Drawing Sheets

METHOD FOR PACKAGING A LIGHT EMITTING DEVICE INCLUDING A METAL REFLECTION LAYER AND A METAL HEAT DISSIPATION LAYER

BACKGROUND OF THE INVENTION

1. Field of the Invention

The present invention relates to a method for packaging a light emitting device, and particularly to a method for packaging a light emitting device having a light emitting diode chip in order to enhance production efficiency and reduce manufacturing cost and further improve light emitting efficiency of the light emitting advice.

2. Related Art

A conventional method for packaging a light emitting element having a light emitting diode chip includes the following steps: first, provide a light emitting diode (LED) chip and mount the LED chip on a groove of a substrate with gluing material, then dispense encapsulant material—into the groove, whereby structure of the light emitting element is created. However, to light the light emitting element, electrodes disposed on the LED chip have to be electrically connected to external circuits. Therefore, in the processes of packaging the light emitting element the electrodes of the LED chip must be preformed to have connecting points for being connected with the external circuits, but such processes of preforming the connecting points and connecting the external circuits multiply the procedure of the light emitting element package and obstacle development of the package.

Moreover, for the LED chip is mounted on the substrate with gluing material, thermal conduction might be affected because of the gluing material and multiple layers which have different conduction coefficients, and such influence immediately lowers light emitting performance and lifespan of the light emitting element. In addition, light from the light emitting element is emitted through the gluing material to outside, and only a minor portion of light reflected from inner sides of the groove to the gluing material, so the illumination and light emitting performance is. significantly reduced.

SUMMARY OF THE INVENTION

Accordingly, an object of the present invention is to provide a method for packaging a light emitting device having a light emitting diode (LED) chip, wherein the LED chip of electrodes is directly contacted with a carrier formed with electrodes without further connecting with external circuits and preforming connecting points, so that to simplify packaging procedure and reduce manufacturing cost and enhance production efficiency; Moreover, thanks to the light emitting device is produced by innovative and continuous processes, light emitting performance and illumination is greatly increased.

To achieve the above-mentioned object, the method for packaging a light emitting element includes a step of providing a carrier formed with an anode electrode and a cathode electrode, a step of providing a light emitting object by utilizing a light emitting diode (LED) chip having a positive and negative electrodes, a step of directly contacting the carrier and the light emitting diode chip to establish electrical communication among the anode and cathode electrodes and the positive and negative electrodes, and a step of firmly bonding the carrier and the light emitting diode chip.

According to the method mentioned above, the anode electrode and the cathode electrode of the carrier are formed by a technique of mesh print, micro etching, stamping, integrally molding, adhesion, thermo-compression, ink-jet printing, or laser activation and so on.

Another object of the present invention is to further include a step of reflection defined by coating a first metal layer of high reflection coefficient after the carrier and the LED chip contacted to each other.

Still another object of the present invention is to further include a step of high heat dissipation defined by coating a second metal layer of high thermal conductivity coefficient on the first metal layer.

DESCRIPTION OF THE PREFERRED EMBODIMENTS

Figure 1:
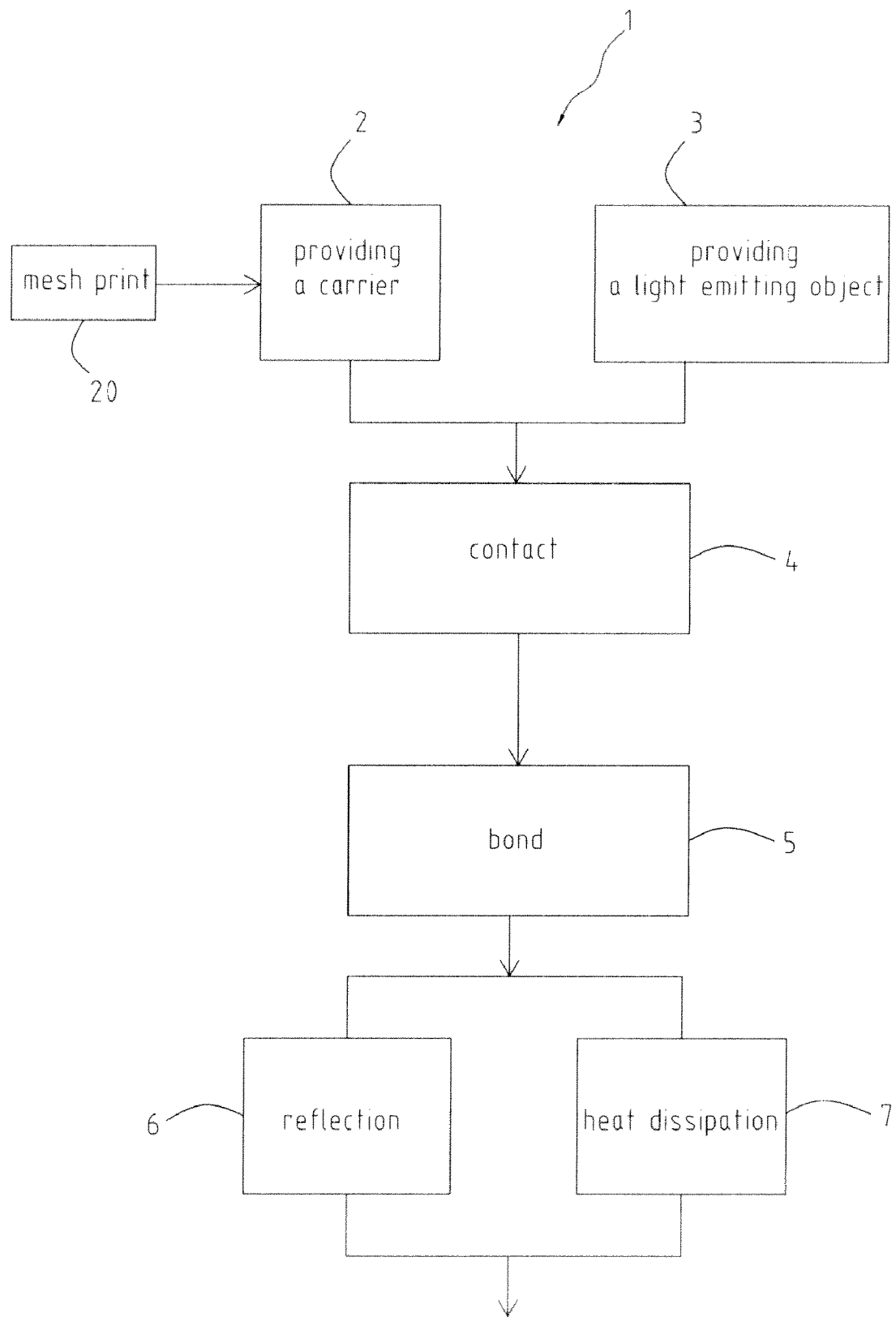
FIG. 1 is a flowchart of a method for packaging a light emitting device of the present invention.

Referring to FIG. 1 illustrating a flowchart of a method 1 for packaging a light emitting device of the present invention, the method 1 includes following steps: a step 2 of providing a carrier formed with electrodes including an anode electrode and a cathode electrode, a step 3 of providing a light emitting object 81, a step 4 of contact, a step 5 of bond, a step 6 of reflection, and a step 7 of heat dissipation, wherein the carrier can be selected from a material originally having the anode electrode and cathode electrode, or the anode electrode and cathode electrode of the carrier are formed separately by a technique of mesh print, micro etching, stamping, integrally molding, adhesion, thermo-compression, ink-jet printing, or laser activation and so on. Furthermore, the carrier is made of soft or rigid material. The step 3 of providing the light emitting object 81 is to use a light emitting diode (LED) chip having a positive electrode and a negative electrode as the light emitting object 81, wherein the LED chip can be a Surface Mount Device Type (SMD) or a Vertical Type. The step 4 of contact is defined by directly contacting the anode electrode and the cathode electrode of the carrier with the positive electrode and the negative electrode of the light emitting diode chip to establish electrical communication, wherein the contact is performed through a technique of Ball Grid Array (BGA) package or Surface Mount Technology (SMT), or through general electric wires. The step 5 of bond is defined by firmly bonding the carrier with the light emitting diode chip, wherein the bonding is through a way of continuously compressing and heating or through an adhesive to firmly join the anode electrode and the cathode electrode of the carrier with the positive electrode and the negative electrode of the LED chip. The step 6 of reflection and step 7 of heat dissipation are performed after the step 5 of bond by coating a first metal layer of high reflection coefficient and a metal heat dissipation layer of high thermal-conduction coefficient in order, wherein the first metal layer is made of gold (Au), silver (Ag), nickel (Ni), chromium (Cr) or materials composed thereof, and the metal heat dissipation layer is made of copper, gold, argent, silver, nickel, tin, titanium, platinum, palladium, tungsten, molybdenum, lead or materials composed thereof. The first metal layer and the second metal layer of high thermal conductivity coefficient are being rolled and compressed or stamped and are formed through steps of: dispensing negative photo-resist (PR) on the anode electrode and the cathode electrode of the carrier and then being exposed to ultraviolet radiation (UV) and developed, and finally through thin film deposition or electroplating. Accordingly, the light emitting device is produced with the aforesaid steps.

Figure 2A:
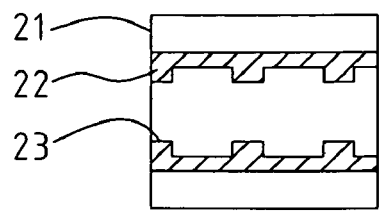
FIGS. 2A to 2F are a first embodiment of the present invention.
Figure 2D:
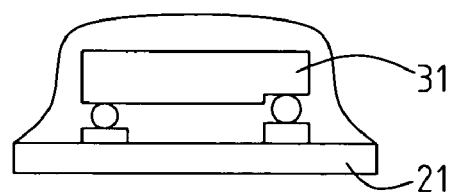
Figure 2B:
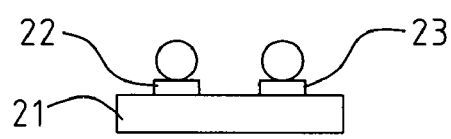
Figure 2E:
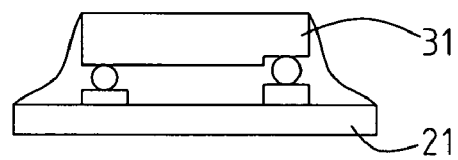
Figure 2C:
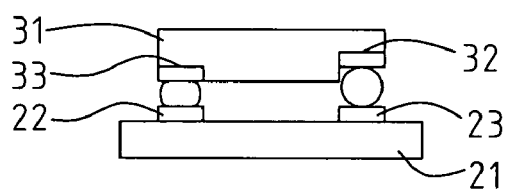
Figure 2F:
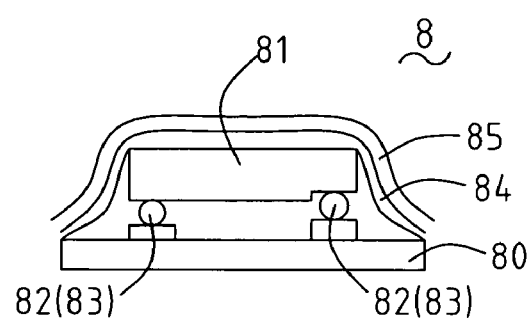

Referring to FIGS. 2A to 2F illustrating a first embodiment of the present invention, in this preferred embodiment, the method 1 for packaging the light emitting device includes the step 2 of providing a carrier 21, which is etched to form an anode electrode 22 and a cathode electrode 22 (as shown in FIGS. 2A and 2B), the carrier 21 being made of light transmittance material, the step 3 of providing a light emitting diode (LED) chip 31 of Surface Mounted Device (SMD) Type, the LED chip 31 having a positive electrode 32 and a negative electrode 33. Then solder tin balls (not displayed) on the anode electrode 22 and the cathode electrode 23 of the carrier 21 with the technique of Ball Grid Array (BGA) package (alternatively, the tin balls can be soldered on the LED chip 31), and then directly contact the carrier 21 and the LED chip 31 to establish electrical communication among the anode and cathode electrodes 22, 23 and the positive and negative electrodes 32, 33 (as the step 4, shown in FIG. 2C); then continuously compress and heat the carrier 21 and the LED chip 31 to bond together as the step 5 (as shown in FIG. 2C); After the preceding steps, dispense a negative photo-resist (PR) on the carrier 21 and the LED chip 31, then the carrier 21 and the LED chip 31 are exposed to ultra radiation (UV) and developed to define an exposed upper portion of the LED chip 31 (as shown in FIG. 2E), and then through thin film deposition or electroplating to form the first metal layer 84 of high reflection coefficient and the metal heat dissipation layer 85 of high thermal-coefficient (as the steps 6 and 7, shown in FIG. 2F). Consequently, the light emitting device 8 is produced, and light emitting efficiency is greatly enhanced.

Figure 3A:
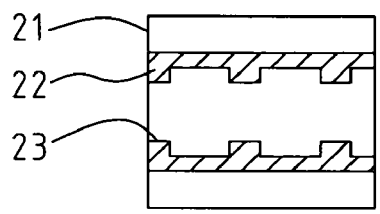
FIGS. 3A to 3F are a second embodiment of the present invention.
Figure 3C:
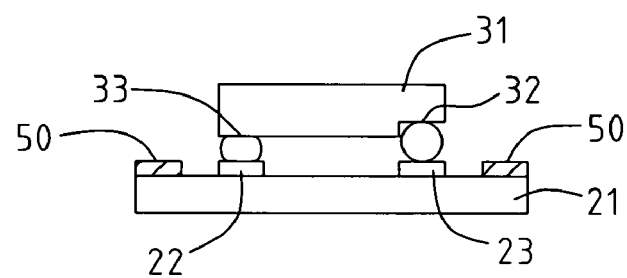
Figure 3B:
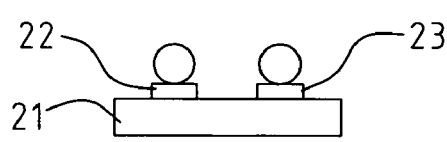
Figure 3D:
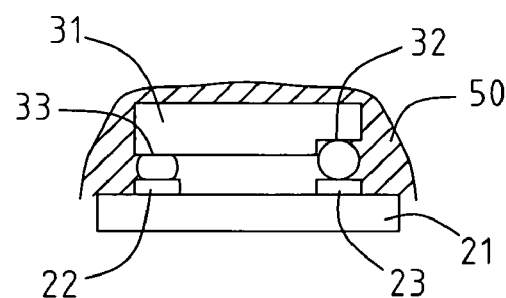
Figure 3E:
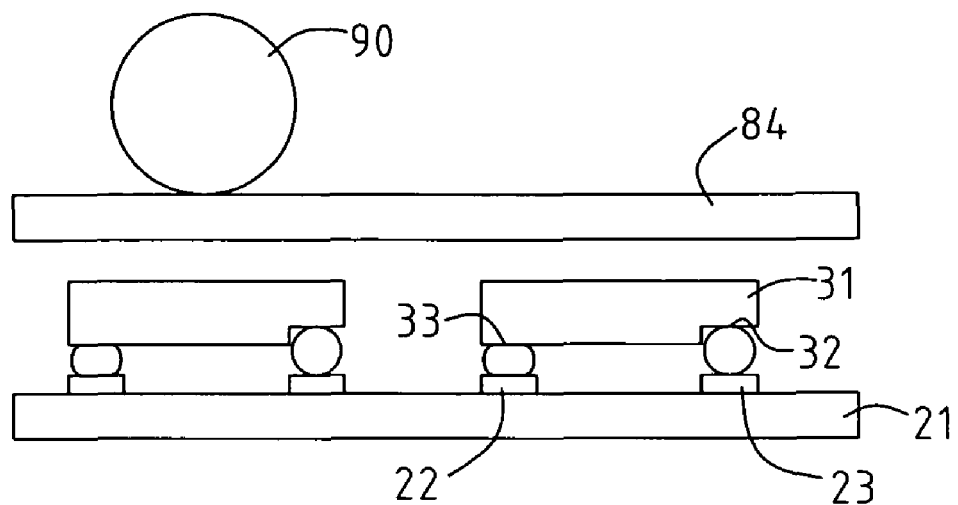
Figure 3F:
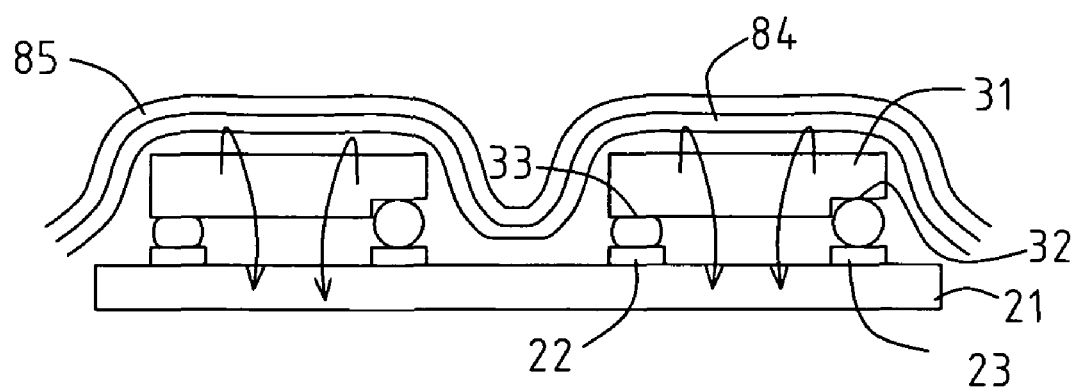

Referring to FIGS. 3A to 3F illustrating a second embodiment of the present invention, as described in the step 2, in this embodiment, the carrier 21 is formed with the anode electrode 22 and the cathode electrode 23 by etching technique or other appropriate techniques (as shown in FIGS. 3A and 3B); Alternatively, the procedure of forming the anode and cathode electrodes 22, 23 can be omitted when the carrier 21 is replaced with a material of anode and cathode electrodes, or the carrier 21 originally has anode and cathode electrodes. Following the preceding step, providing the LED chip 31 of the SMD type having the positive and negative electrodes 32, 33 as the step 3; then solder tin balls on the carrier 21 with the technique of BGA package (alternatively, the tin balls can be soldered on the LED chip 31), and then directly contact the carrier 21 and the LED chip 31 to establish electrical communication among the anode and cathode electrodes 22, 23 and the positive and negative electrodes 32, 33 (as the step 4, shown in FIG. 3C), furthermore, continuously compress and heat the carrier 21 and the LED chip 31 to bond together as the step 5; Pre-determine adhesive portions on the carrier 21 bonded with the LED chip 31 and partially dispense adhesive 50 thereon (as shown in FIG. 3C), wherein the adhesive, for example, is a fixing glue (or the adhesive 50 is dispensed fully as shown in FIG. 3D); then the carrier 21 and the LED chip 31 are further being rolled and compressed by the soft roller 90 (as shown in FIG. 3E), or being stamped. Finally, carry out the step 6 and the step 7 as described above that the first metal layer 84 of high reflection coefficient (served as a reflective layer), the metal heat dissipation layer 85 of high thermal-coefficient, the LED chip 31 and the carrier 21 are closely bonded to each other, whereby a light cup (not labeled) is formed (as shown in FIG. 3F), and the light emitting device 8 is produced.

Figure 4A:
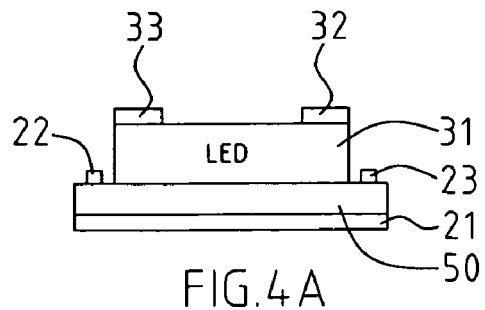
FIGS. 4A to 4D are a third embodiment of the present invention.
Figure 4B:
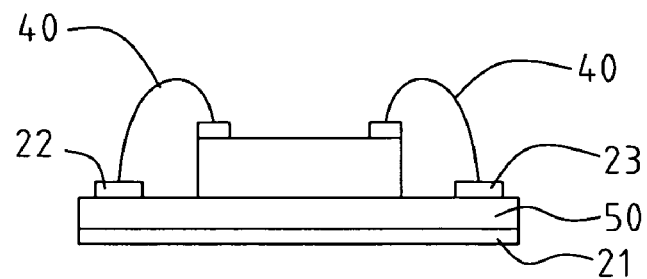
Figure 4C:
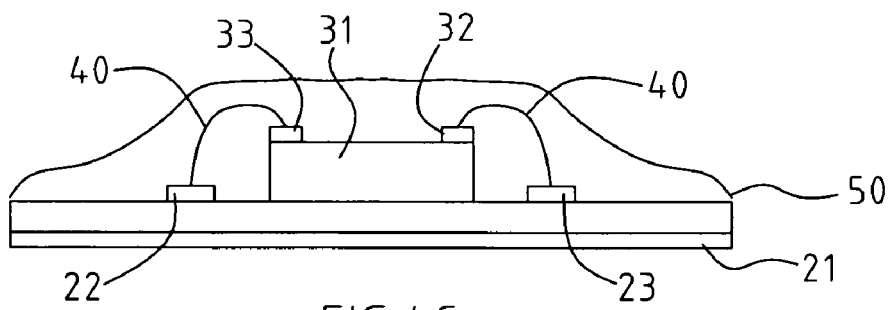
Figure 4D:
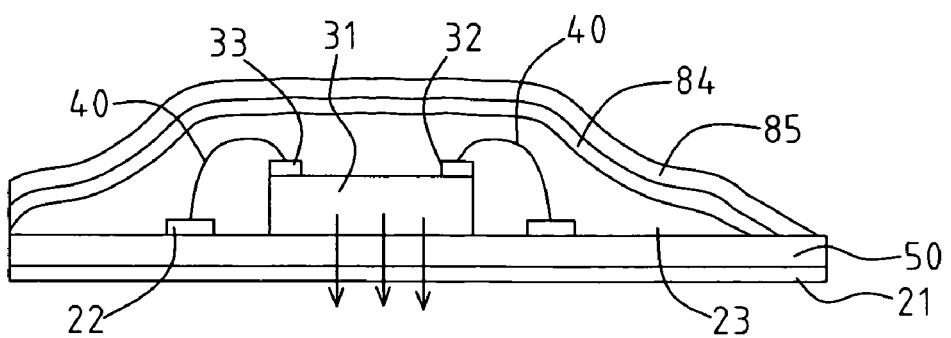

Referring to FIGS. 4A to 4D illustrating a third embodiment of the present invention, in this embodiment, the step 2 of providing the carrier 21 formed with the anode and cathode electrodes 22, 23 and the step 3 of providing the LED chip 31 of the positive and negative electrodes 32, 33 are the same; the LED chip 31 is reversely mounted on the carrier 21, wherein the carrier 21 is dispensed with the adhesive 50 as shown in FIG. 4A (for example, the fixing glue); then contact the anode and cathode electrodes 22, 23 of the carrier 21 and the positive and negative electrodes 32, 33 of the LED chip 31 through electric wires 40 to establish electrical communication therebetween (as shown in FIG. 4B); then further roll and compress the combined carrier 21 and LED chip 31 through the soft roller 90 (as depicted in the FIG. 3E of the second embodiment); finally, carry out the step 6 and the step 7 as described above that the first metal layer 84 of high reflection coefficient (served as a reflective layer), the metal heat dissipation layer 85 of high thermal-coefficient, the LED chip 31 and the carrier 21 are closely bonded to each other, whereby a light cup (not labeled) is formed (as shown in FIG. 3F), and the light emitting device 8 is produced.

Figure 5:
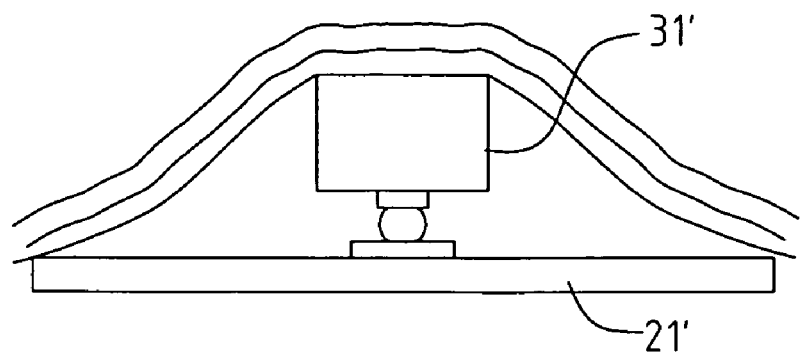
FIG. 5 is a fourth embodiment of the present invention.
Figure 6A:
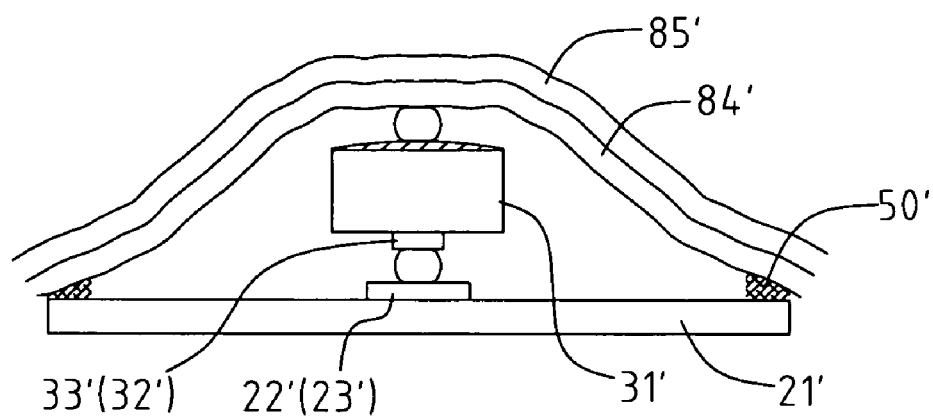
FIGS. 6A and 6B are respectively a fifth embodiment and a sixth embodiment.
Figure 6B:
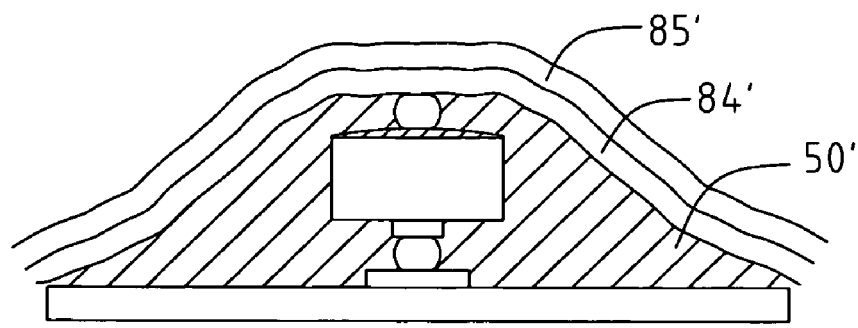

Referring to FIGS. 5 and 6A to 6B respectively illustrating a fourth, fifth, and sixth embodiments of the present invention, these three embodiments utilize a LED chip 31' of vertical type, and other steps of the method for packaging the light emitting device are the same as described above in the first and the second embodiments. With reference to FIG. 5, after a carrier 21' having an anode electrode 22' and a cathode electrode 23' is firmly bonded with the LED chip 31' of a positive electrode 32' and negative electrode 33' (as the step 5 described above), appropriately dispense negative photo-resist (PR) on the carrier 21' and the LED chip 31', and then expose them to ultraviolet radiation (UV) and developed to define an exposed upper portion of the LED chip 31', and finally through thin film deposition or electroplating to form the first metal layer 84' 'and the metal heat dissipation layer 85'. Accordingly, the light emitting device is produced.

Referring to FIG. 6A, the carrier 21' is formed with the anode electrode 22 and the cathode electrode 23 by etching technique or other appropriate techniques; As mentioned above, the procedure of forming the anode and cathode electrodes 22', 23' can be omitted when the carrier 21' is replaced with a material of anode and cathode electrodes, or the carrier 21' originally has anode and cathode electrodes. Then solder tin balls on the carrier 21' with the technique of BGA package (alternatively, the tin balls can be soldered on a positive electrode 32' and negative electrode 33' of the LED chip 31'), and directly contact the LED chip 31' with the carrier 21' to establish electrical communication among the anode and cathode electrodes 22', 23' and the positive and negative electrodes 32', 33'. Pre-determine adhesive portions on the carrier 21' bonded with the LED chip 31' and partially dispense adhesive 50' thereon, wherein the adhesive 50', for example, is a fixing glue (or fully dispense the adhesive 50 on the carrier 21 and LED chip 31' as shown in FIG. 6B); then the carrier 21' and the LED chip 31' are further being rolled and compressed by the soft roller 90 (as shown in FIG. 3E), or being stamped. Finally, carry out the step 6 and the step 7 as described above that the first metal layer 84' of high reflection coefficient (served as a reflective layer), the metal heat dissipation layer 85' of high thermal-coefficient, the LED chip 31' and the carrier 21' are closely bonded to each other, whereby the light cup concentrating light is formed (as shown in FIG. 3F), and the light emitting device 8 is produced.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method for packaging a light emitting device, comprising:
    a step of providing a carrier formed with electrodes including an anode electrode and a cathode electrode, said anode electrode and said cathode electrode being in direct contact with said carrier;
    a step of providing a light emitting diode (LED) chip served as a light emitting object, the light emitting diode chip having a positive electrode and a negative electrode;
    a step of directly contacting the anode electrode and the cathode electrode of the carrier with the positive electrode and the negative electrode of the light emitting diode chip to establish electrical communication, said positive electrode and negative electrode of said light emitting diode chip directly overlaying said anode electrode and cathode electrode of said carrier;
    a step of firmly bonding the carrier with the light emitting diode chip wherein the step of firmly bonding the carrier with the light emitting diode chip is through a way of being continuously compressed and heated or through an adhesive to join the anode electrode and the cathode electrode of the carrier with the positive electrode and the negative electrode of the light emitting diode chip;
    a step of reflection defined by coating a first metal layer of high reflection coefficient after the carrier and the LED chip are contacted to each other, the first metal layer being rolled and compressed or stamped onto the carrier and the LED chip;
    a step of heat dissipation defined by coating a second metal layer of high thermal conductivity coefficient on the first metal layer, the second metal layer being rolled and compressed or stamped onto the first metal layer, and distinct from said first metal layer.

2. The method of claim 1, wherein the anode electrode and the cathode electrode of the carrier are formed by a technique of mesh print, micro etching, stamping, integrally molding, adhesion, thermo-compression, ink-jet printing, or laser activation and so on.

3. The method of claim 2, wherein the carrier is made of soft or rigid materials.

4. The method of claim 1, wherein the LED chip is a Surface Mount Device Type (SMD) or a Vertical Type.

5. The method of claim 1, wherein the carrier and the LED chip are contacted through a technique of Ball Grid Array (BGA) package or Surface Mount Technology (SMT), or through general electric wires.

6. The method of claim 1, wherein the adhesive is dispensed fully or partially on the LED chip, the carrier, the second metal layer and the first metal layer in order to bond each other.

7. The method of claim 6, wherein the LED chip and carrier bonded with the adhesive are being rolled and compressed or stamped by soft roller to be further coated with the first metal layer and the second metal layer firmly, whereby a light cup being capable of concentrating light is formed accordingly.

8. The method of claim 1, wherein the first metal layer and the second metal layer are formed through steps of: dispensing negative photo-resist (PR) on the anode electrode and the cathode electrode of the carrier and then being exposed to ultraviolet radiation (UV) and developed, and finally through thin film deposition or electroplating.

9. The method of claim 8, wherein the first metal layer is made of gold (Au), silver (Ag), nickel (Ni), chromium (Cr) or materials composed thereof.

10. The method of claim 8, wherein the second metal layer is made of copper, gold, silver, nickel, tin, titanium, platinum, palladium, tungsten, molybdenum, lead or materials composed thereof.

11. A light emitting device comprising:
    a carrier of an anode electrode and an cathode electrode, said anode electrode and said cathode electrode being in direct contact with said carrier;
    a light emitting diode chip having a positive electrode and a negative electrode used as a light emitting element;
    a contacting layer arranged between the carrier and the light emitting diode chip to directly contact the anode electrode and the cathode electrode of said carrier with the positive electrode and the negative electrode of said light emitting diode chip, said positive electrode and negative electrode of said light emitting diode chip directly overlaying said anode electrode and cathode electrode of said carrier to achieve electrical communication there between;
    a bonding layer firmly bonding the carrier and the LED chip wherein the carrier and the light emitting diode chip are bonded through a way of continuously compressing and heating or through an adhesive to firmly join the anode electrode and the cathode electrode of the carrier with the positive electrode and the negative electrode of the light emitting diode chip;
    a reflective layer of high reflection coefficient being formed of metal having a film-like shape, the reflective layer coating the bonding layer; and
    a heat dissipation layer of high heat dissipation coefficient being formed of metal having a film-like shape, the heat dissipation layer coating the reflective layer and distinct from said reflective layer.

12. The light emitting advice of claim 11, wherein the reflective layer is made of gold (Au), silver (Ag), nickel (Ni), chromium (Cr) or materials composed thereof.

13. The light emitting advice of claim 12, wherein the heat dissipation layer is made of copper, gold, silver, nickel, tin, titanium, platinum, palladium, tungsten, molybdenum, lead or materials composed thereof.

14. The light emitting advice of claim 11, wherein the carrier is made of soft materials or rigid materials.

* * * * *